United States Patent [19]
Inoue et al.

[11] Patent Number: 5,693,959
[45] Date of Patent: Dec. 2, 1997

[54] THIN FILM TRANSISTOR AND LIQUID CRYSTAL DISPLAY USING THE SAME

[75] Inventors: Shunsuke Inoue, Yokohama; Takeshi Ichikawa, Hachioji, both of Japan

[73] Assignee: Canon Kabushiki Kaisha, Tokyo, Japan

[21] Appl. No.: 629,466

[22] Filed: Apr. 10, 1996

[30] Foreign Application Priority Data

| Apr. 10, 1995 | [JP] | Japan | 7-084106 |
| Mar. 3, 1996 | [JP] | Japan | 8-081485 |

[51] Int. Cl.$^6$ .............................. H01L 27/01; H01L 29/76
[52] U.S. Cl. ............... 257/66; 257/336; 257/347; 257/408; 257/387; 349/43; 349/48
[58] Field of Search ............... 257/66, 59, 72, 257/336, 344, 348, 347, 408, 365, 153, 346, 387; 349/43, 48

[56] References Cited

U.S. PATENT DOCUMENTS

| 4,859,618 | 8/1989 | Shikata et al. | 257/346 |
| 5,218,232 | 6/1993 | Yuzurihara et al. | 257/754 |
| 5,242,844 | 9/1993 | Hayashi | 437/40 |
| 5,250,835 | 10/1993 | Izawa | 257/408 |
| 5,466,961 | 11/1995 | Kikuchi et al. | 257/379 |

FOREIGN PATENT DOCUMENTS

| 589478A2 | 3/1994 | European Pat. Off. |
| 602250A1 | 6/1994 | European Pat. Off. |
| 635890A1 | 1/1995 | European Pat. Off. |
| 58-158971 | 9/1983 | Japan . |
| 60-136262 | 7/1985 | Japan . |
| 3-038755 | 6/1991 | Japan . |
| 3220774 | 9/1991 | Japan | 257/408 |
| 5267327 | 11/1993 | Japan | 257/408 |

OTHER PUBLICATIONS

Patent Abstracts of Japan, vol. 017, No. 453 (E-1417, Aug. 19, 1993 & JP 05 102483 A (Sharp Corp.), Apr. 23, 1993.
Patent Abstracts of Japan, vol. 018, No. 022 (E-1490), Jan. 13,1994 & JP 05 259457 A (Sharp Corp.) Oct. 8, 1993.
Minoru Matsuo et al: "Poly-Si TFTS With LDD Structure Fabricated At Low Temperature", Aug. 29, 1993, International Conference on Solid State Devices and Materials, pp. 437-439 XP000409416, p. 438, col.2; Fig. 4.

Primary Examiner—Tom Thomas
Assistant Examiner—Fetsum Abraham
Attorney, Agent, or Firm—Fitzpatrick, Cella, Harper & Scinto

[57] ABSTRACT

A thin film transistor comprises a source region, a drain region and a channel region formed in a thin film silicon region on an insulating substrate and a gate electrode formed via a gate insulating film on the channel region; at least one of the source region and the drain region has a high-concentration impurity region and a low-concentration impurity region; the channel region is in contact with the low-concentration impurity region; the low-concentration impurity region comprises at least a first region and a second region; the first region comprises a thin film having about the same thickness as the channel region; the second region comprises a thin film having about the same thickness as the high-concentration impurity region which is thicker than the first region. A liquid crystal display has TFT substrates wherein the thin film transistors are arranged in the form of a matrix. A liquid crystal display is equipped with a plurality of the thin film transistors, wherein either of an electrode of the source region and an electrode of the drain region is connected to a transparent electrode.

14 Claims, 7 Drawing Sheets

THIN FILM TRANSISTOR AND LIQUID CRYSTAL DISPLAY USING THE SAME

BACKGROUND OF THE INVENTION

1. Field of the Invention

The present invention relates to a semiconductor device, more specifically a thin film transistor for use in an active matrix type liquid crystal display.

2. Related Background Art

In recent years, thin film transistors (TFTs) have been particularly energetically developed as switching elements for active matrix substrates in liquid crystal displays. Above all, the TFTs using thin films of a polysilicon (polycrystal) or thin films of a substance close to a single crystal obtained by modifying the polysilicon have been put to practical use as the TFTs of small panels having a size of about 0.5 to 2.0 inches diagonal.

The TFTs mainly comprising the polysilicon have been developed as a sequential stagger type in which a gate electrode is arranged on a channel, but there have been reported the various results of researches regarding two points of (1) the decrease of leak current between a source and a drain and (2) the increase of driving force by the improvement of mobility, and regarding the increase of yield and the improvement of a manufacturing technique.

As a result, it is known that fundamental techniques to be improved are two points, i.e., the relief of an electric field concentrated at a drain end for the sake of the decrease of the leak current between the source and the drain, and the formation of the thinnest possible films of the polysilicon for the sake of the decrease of the leak current and the improvement of the mobility.

Here, FIGS. 10A and 10B show the sectional views of conventional thin film transistors. In FIG. 10A, reference numeral 601 is an insulating substrate, numeral 602a is a high-concentration n$^+$ type source region, 602b is a low-concentration n$^-$ type source region, 602c is a channel region, 602d is a low-concentration n$^-$ type drain region, 602e is a high-concentration n$^+$ type drain region, and 602a to 602e are formed in a single polysilicon region. Reference numeral 603 is a gate insulating film such as a silicon oxide film, numeral 604 is a polysilicon gate electrode, 605 is an interlayer insulating film, and 606a and 606b are a source and a drain electrode made of, for example, an aluminum alloy, respectively.

On the other hand, in FIG. 10B, reference numeral 607 is an insulating substrate, numeral 608a is a high-concentration n$^+$ type source region having a large film thickness, 608b is a low-concentration n$^-$ type region which becomes a channel region, 608c is a high-concentration n$^+$ type drain region having a large film thickness, and 608a to 608c are formed in a single polysilicon region. Reference numeral 609 is a gate insulating film such as a silicon oxide film, numeral 610 is a polysilicon gate electrode formed on the channel region via the gate insulating film, 611 is an interlayer insulating film for the sake of insulation between the drain and the source, and 612a and 612b are a source and a drain electrode made of, for example, an aluminum alloy, respectively.

(Role of the low-concentration n$^-$ films)

The low-concentration n$^-$ films 602b, 602d have the effect of relieving the concentration of the electric field at the drain end when the gate is off, and therefore it is already known that they are effective to inhibit the leakage of current. For example, Japanese Patent Publication No. 3-38755 discloses this fact.

On the other hand, for example, as disclosed in Japanese Patent Publication No. 6-69094, the thickness of the polysilicon is required to be decreased in order to increase the ON current of the polysilicon TFT and to decrease the OFF current. In the same publication, it has also been described that the regulation of the thickness of the polysilicon to a level of 10 to 40 nm is effective. Furthermore, Japanese Patent Application Laid-open No. 58-158971 has disclosed a structure in which no low-concentration n$^-$ film is formed and the film thickness of source-drain portions is larger than that of a channel in order to lower the resistance of a contact portion, but any relation with the low-concentration n$^-$ film has not been described.

Additionally, in consideration of the unevenness of the film thickness in the manufacturing process of the TFT, the film thickness unevenness of the low-concentration n$^-$ film has a large influence on the unevenness of the driving force, which is not preferable from the viewpoints of a manufacturing margin and yield. Particularly in a liquid crystal display in which many transistors having such a constitution are laminated, the unevenness of the driving force of the transistors leads to the unevenness of an image quality, so that there sometimes occurs a failure which cannot be detected from the judgement of the performance of mere switching.

Thus, if the polysilicon thickness of the channel region and the source-drain portions is reduced, the resistance of the low-concentration n$^-$ film increases in an inverse proportion. In consequence, as shown in FIG. 11, extremely large parasitic resistances $r_s$, $r_d$ occur in the thin film transistor TFT. These parasitic resistances $r_s$, $r_d$ reduce a drain current $I_d$ in a triode characteristic region and a pentode characteristic region into which the operation region of the TFT is divided into two regions, as represented by the following equations:

Triode:

$$I_d = \mu C_{ox}(W/L)(V_{GS}' - V_{TH} - 1/2 V_{DS}') V_{DS}'$$

Pentode:

$$I_d = (1/2) \mu C_{ox}(W/L)(V_{GS}' - V_{TH})^2$$

Hence, $$V_{GS}' = V_{GS} - I_d r_s$$

$$V_{DS}' = V_{DS} - I_d (r_s + r_d)$$

wherein

μ is a mobility of a carrier in the polysilicon,

Co is a capacity obtained by the dielectric constant of an oxide film/the thickness of the oxide film, W is a gate width, L is a gate channel length, $V_{GS}'$ is a gate-source voltage, $V_{TH}$ is a threshold voltage or a pinch-off voltage, $V_{DS}'$ is a drain-source voltage, $V_{GS}$ is a gate electrode-source electrode voltage, and $V_{DS}$ is a drain electrode-source electrode voltage.

Thus, for the sake of the formation of the TFT having a higher performance, it is an essential factor that the parasitic resistances $r_s$, $r_d$ are reduced as much as possible, while the length of the low-concentration n$^-$ film enough to sufficiently inhibit the leakage of current between the source and the drain is ensured.

Thus, an object of the present invention is to provide a thin film transistor which can solve the above-mentioned problems and in which a parasitic resistance can be decreased as much as possible, while a leak current is sufficiently inhibited, and another object of the present case is to provide a liquid crystal display in which the thin film transistors are used.

SUMMARY OF THE INVENTION

In order to solve the above-mentioned problems, the present inventors have intensively investigated, and as a result, the following invention has been obtained. That is to say, the present invention is directed to a thin film transistor which comprises a source region, a drain region and a channel region formed in a thin film silicon region on an insulating substrate and a gate electrode formed via a gate insulating film on the channel region; at least one of the source region and the drain region having a high-concentration impurity region and a low-concentration impurity region; the channel region being in contact with the low-concentration impurity region; the low-concentration impurity region comprising at least a first region and a second region; the first region comprising a thin film having about the same thickness as the channel region; the second region comprising a thin film having about the same thickness as the high-concentration impurity region which is thicker than the first region. According to this constitution, a source resistance or a drain resistance can be decreased, so that driving force can be improved.

Furthermore, the thin film transistor is characterized in that the gate electrode is divided into a plurality of portions in flow directions of source•drain current, and all the divided gate electrodes are connected at the same potential, so that the gate is lengthened but the reliability of the thin film transistor can correspondingly be improved. The thin film transistor is also characterized in that a part of the gate electrode covers at least a part of the second region, whereby the area of the gate electrode portion can be decreased. Moreover, the thin film transistor is characterized in that the gate electrode is divided into a plurality of portions in flow directions of the source-drain current, and the channel regions under the divided gate electrodes are connected to each other via the low-concentration impurity region, whereby the leakage of the current can be inhibited.

The present invention also provides a liquid crystal display having TFT substrates on which the above-mentioned thin film transistors are arranged in the form of a matrix. More specifically, the present invention is also connected to a liquid crystal display equipped with a thin film transistor which comprises a source region, a drain region and a channel region formed in a thin film silicon region on an insulating substrate and a gate electrode formed via a gate insulating film on the channel region; at least one of the source region and the drain region having a high-concentration impurity region and a low-concentration impurity region; the channel region being in contact with the low-concentration impurity region; the low-concentration impurity region comprising at least a first region and a second region; the first region comprising a thin film having about the same thickness as the channel region; the second region comprising a thin film having about the same thickness as the high-concentration impurity region which is thicker than the first region; either of an electrode of the source region and an electrode of the drain region being connected to a transparent electrode.

In the present invention, a portion not contributing to the leakage of the low-concentration film which increases the parasitic resistance of the thin film transistor is thicken to acquire the effect of the thin film formation without the influence of the unevenness of a process, and as a result, the ON/OFF ratio of the transistor can be improved, maintaining a process margin. That is to say, the leak current of the source•drain can be inhibited at a conventional level, and the source-drain parasitic resistance can be decreased, so that the driving force can be improved and the excellent ON/OFF ratio can be obtained.

Furthermore, according to the present invention, the source-drain parasitic resistance of the thin film transistor can be decreased, and the drain current increases under conditions of the same gate voltage. In consequence, a voltage to be effectively applied between the gate and the source or between the drain and the source of the transistor increases, and the ON/OFF current ratio increases. In particular, when the thin film transistor is applied to the liquid crystal display, a high contrast can be obtained. Even when the thickness of the polysilicon is as small as about 10 nm, there can be reduced a failure that the polysilicon is cut owing to the roughness of the substrate, with the result that the yield of the thin film transistor TFT can also be improved. An active matrix substrate in which such a TFT is integrated is suitable to realize the liquid crystal display capable of giving an excellent image quality.

When a dual gate structure is taken, the concentration of an electric field at the drain end can be relieved and an OFF current decreases, so that the ON/OFF current ratio can be increased. Moreover, if one of the two transistors connected in series crosses a grain boundary to completely bring about a short circuit, another transistor can keep up a function as a switch, so that the transistors can be provided in the high yield. In the case of the dual gate structure, the resistance of the low-concentration $n^-$ film which is newly generated can be further lowered, so that the ON current of the drain-source can be increased.

Since the thin film regions of the source and the drain are decreased, the resistance of the low-concentration $n^-$ film can be further lowered, so that an LDD structure utilizing a side wall insulating film can be taken. In consequence, a relative positional relation between the gate electrode and a high-concentration $n^+$ film does not change by the alteration of the process, whereby the TFT having stable characteristics can be manufactured in the high yield.

DETAILED DESCRIPTION OF THE PREFERRED EMBODIMENTS

Embodiment 1

Figure 1:
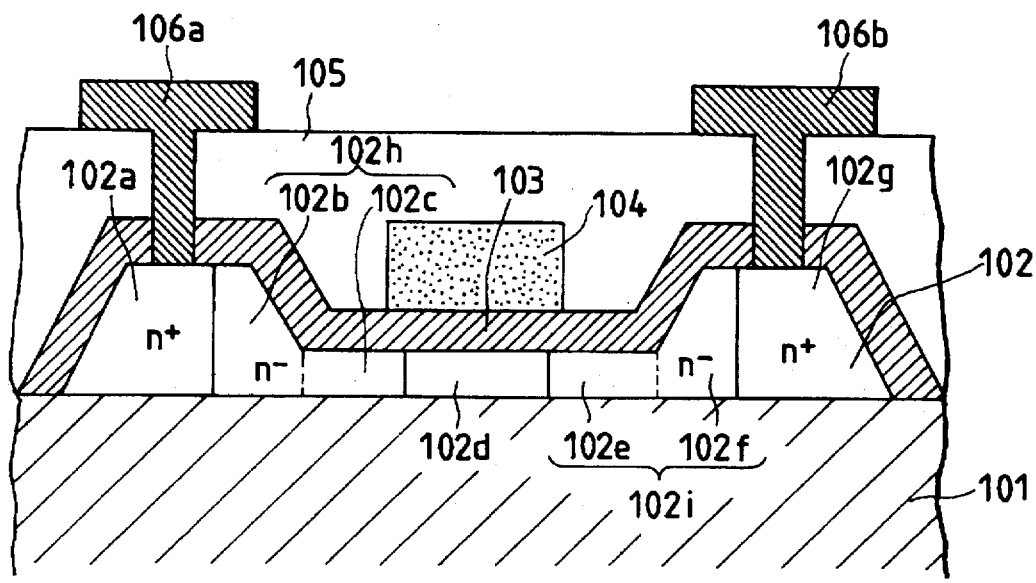
FIG. 1 is a sectional view of one embodiment of a TFT according to the present invention.

FIG. 1 shows the sectional view of an embodiment 1 of a thin film transistor according to the present invention. On an insulating substrate 101 whose surface is insulated, a polysilicon (polycrystal Si) 102 is formed, and on the surface of this polysilicon 102, a gate insulating film 103 such as a silicon oxide film is formed. The polysilicon 102 comprises a high-concentration $n^+$ type source region 102a, a thick region 102b and a thin region 102c of a low-concentration $n^-$ type source region 102h, a channel region 102d, a thin region 102e and a thick region 102f of a low-concentration $n^-$ type drain region 102i, and a high-concentration $n^+$ type drain region 102g. These regions 102a to 102i are formed in the single polysilicon region. In short, this single polysilicon region comprises the thin channel region 102d, the source region and the drain region. The source region comprises the low-concentration $n^-$ region 102h close to a gate electrode 104 and the high-concentration $n^+$ region 102a. Similarly, the drain region comprises the low-concentration $n^-$ region 102i and the high-concentration $n^+$ region 102g. The gate electrode 104 confronts the channel region 102d with the interposition of the gate insulating film 103. Reference numerals 106a, 106b are metallic wiring layers which become the source region and the drain region, respectively, and they come in contact with the high-concentration $n^+$ region 102a, 102g, respectively. Furthermore, reference numeral 105 is an interlayer insulating layer for insulating the gate electrode 103 from the wiring layers.

Next, the structures of the source and the drain will be described. The source low-concentration $n^-$ region 102h, which is in contact with the channel region 102d, comprises the thin region 102c having about the same thickness as the channel region and the thick region 102b which is in contact with and has about the same thickness as the high-concentration $n^+$ region 102a. Similarly, the drain low-concentration $n^-$ region 102i comprises the first thin region 102e which is in contact with the channel region and the second thick region 102f which is in contact with the high-concentration $n^+$ region 102g.

According to the above-mentioned constitution, while the contact area between the channel region and the drain region is sufficiently decreased, the resistance of the low-concentration $n^-$ region can be decreased, thereby constituting a thin film transistor having a high ON/OFF ratio than in a conventional case.

Next, reference will be made to materials of the respective parts and variations of the structure which can be contrived with reference to FIG. 1. The insulating substrate 101 whose surface is insulated can be made of quartz, glass or silicon. The silicon substrate whose surface comprises a silicon oxide film formed by oxidation can be used. Any substrate may be covered with a silicon oxide film or a silicon nitride film by a CVD method. Furthermore, these films may be laminated in a multi-layer state.

As the polysilicon 102, a thin film deposited on the insulating substrate by the CVC method is a typical example, but there can also be used a single crystal silicon or a thin film which can be formed by subjecting the polysilicon to laser anneal to bring about crystallization, and then extremely reducing a grain boundary. In addition, amorphous Si can be deposited on the insulating substrate, and then polycrystallized by the laser anneal.

As the gate electrode 103, there can be preferably used a silicon oxide film obtained by thermally oxidizing a part of the polysilicon, a silicon oxide film deposited by the CVC method and a silicon nitride film (which can be formed by a plasma CVC method). For the formation of these films, already known methods can be employed, and they are described in detail in literature regarding this technical field.

As the gate electrode 104, there can be suitably used the polysilicon doped in a high-concentration $n^+$ state, a metallic substance such as Al, W, Cr, Ti, Ta or Mo, or a polycide obtained by alloying a metallic layer on the polysilicon. The gate electrode 104 should be selected from these materials in consideration of the thickness of the channel polysilicon, the necessary threshold voltage of the TFT, the work function of the gate electrode and a heat-resistant temperature.

As the interlayer insulating layer 105, there can be used a silicon oxide film, a silicon nitride film, a silicon nitride oxide film or a multilayer obtained by laminating these films.

As the wires 106a, 106b of the source and the drain, there can be used Al, W, Cr, Ti, Ta, Mo, its alloy, a silicide or a multi-layer film. Furthermore, in order to prevent an extreme interdiffusion from occurring between the silicon and the wiring layer, a barrier metal may be used as needed. Although not shown, a surface protective film can be laminated on the surface of the structure shown in FIG. 1 in order to prevent the surface layer of the structure from deteriorating.

Next, a manufacturing method of the thin film transistor having the sectional structure shown in FIG. 1 will be described with reference to FIGS. 2A to 2E.

The manufacturing method which will be hereinafter described is a method for manufacturing one typical example of the above-mentioned various practical structures, and it is within the category of the present invention to apply other materials and conventional self-explanatory techniques in realizing the structure, so far as they are based on the gist of the present invention.

Figure 2A:
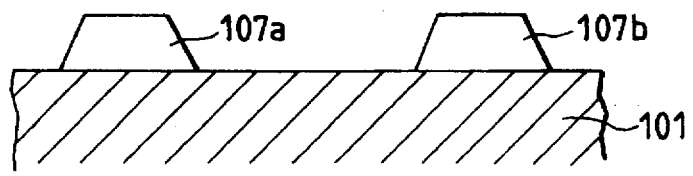
FIGS. 2A to 2E are sectional views illustrating a manufacturing process of one embodiment of the TFT according to the present invention.
Figure 2B:
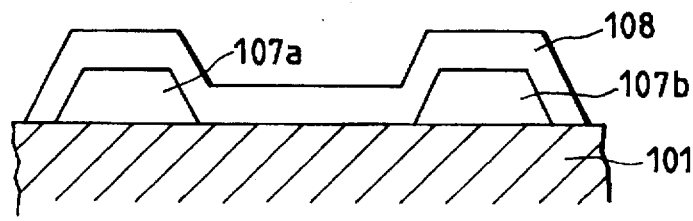

On an insulating substrate 101 whose surface is insulated, a polysilicon is deposited as thick as 50 to 500 nm in a temperature range of 550° to 650° C. by the thermal decomposition of silane, followed by patterning, to form thick regions 107a, 107b which become the contact portions of a source and a drain (FIG. 2A). The thickness of the thick regions 107a, 107b can be decided in view of the resistance of a low-concentration $n^-$ layer and a selectivity at the time of contact etching. Particularly in the case that the TFT is used as the active switching element of the liquid crystal display, the flatness of the TFT is an important factor for the decision, because if a large step is present on the surface of the device, the orientation of the liquid crystal is difficult. In FIG. 2A, the side surfaces of the thick regions 107a, 107b, particularly the outside surfaces of the etched portions of the thick regions 107a, 107b are tapered, but a taper angle can be decided in consideration of the controllability of the etching and the coverage of the wires which depends upon the height of the step. In this embodiment, the taper angle is within the range of 30° to 70° in view of the coverage of the step. Next, a polysilicon thin film 108 which also becomes a channel region is formed (FIG. 2B).

The polysilicon thin film 108 can be formed by a thermal CVC method at 550° to 650° C., and in this case, the thickness of the polysilicon thin film 108 is suitably in the range of 10 to 200 nm. Immediately before the deposition of the polysilicon thin film 108, a spontaneous oxide film should be removed from the surfaces of the thick regions 107a, 107b of the polysilicon so that conduction between the polysilicon thin film 108 and the thick regions 107a, 107b may be assured. In addition, it is suitable that the polysilicon thin film 108 covers the surfaces of the thick regions 107a, 107b so that the thick regions 107a, 107b may not be etched at the time of the etching of the polysilicon thin film 108. The thickness of the polysilicon thin film 108 must be designed in compliance with a thermal oxidation or a deposition for the formation of a gate oxide film which will be next formed. As described in Japanese Patent Publication No. 6-69094, it is desirable from the viewpoint of device characteristics that the thickness of the polysilicon of a channel portion is finally in the range of about 10 to 40 nm. Therefore, when a gate insulating film 103 is formed by the deposition, this thickness can be set from an initial stage, but when the thermal oxidation is employed, the gate insulating film 103 must be beforehand thickly formed as much as the reduction of the polysilicon thickness by the oxidation (about 45% of the thickness of the film to be oxidized). In this embodiment, the pate oxide film is formed in the thermal oxidation, and therefore in order that the final thickness of the channel region film is 20 nm, the thickness of the gate oxide film is 80 nm and the thickness of the deposited polysilicon is 56 nm. The oxidation of the gate can be carried out at 850° to 1200° C., but the oxidation at a high temperature is better for the film quality of the gate oxide film. In this embodiment, the oxidation is made in a dry oxygen atmosphere at 1150° C. A technique using the thermal oxidation and the deposition together can also be used, and in this case, a silicon nitride film is deposited on a thin film thermally oxidized and the oxidation can be then carried out again to form an ONO structure (oxy-nitrided oxide).

Figure 2C:
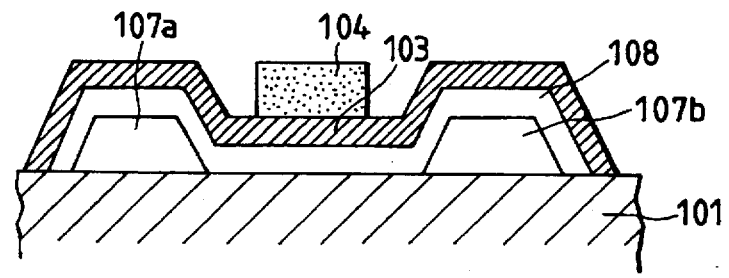

Next, a polysilicon doped with phosphorus was deposited as thick as 400 nm on the gate insulating film 103 to form a gate electrode 104 (FIG. 2C). The thickness of the polysilicon is in the range of 100 to 1000 nm, but when polycide is formed, the thickness of a metal film is also required to be considered. As the dopant, arsenic can also be used, and boron may be doped in order to obtain p-type.

Figure 2D:
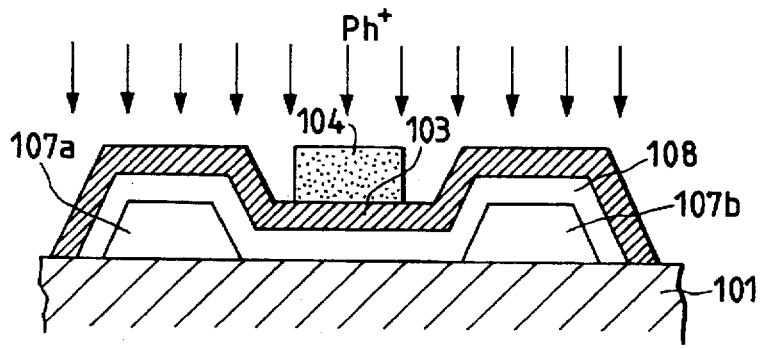

Next, the whole surface is doped with phosphorus ions $Ph^+$ to form a low-concentration $n^-$ region (FIG. 2D). The doping can usually be accomplished by an ion implantation method, but an ion doping equipment developed in recent years in which a mass analysis is not carried out is inexpensive and can be effectively used for activation at a low temperature. The amount of the dopant to be implanted can be decided in consideration of both the relieve of the electric field and the driving force. The amount of the dopant is in the range of $10^{12}$ to $5\times10^{14}$ $cm^{-2}$, but according to experiments by the present inventors, it is apparent that the amount is suitably in the range of $10^{13}$ to $10^{14}$ $cm^{-2}$. As the ions to be doped, other n-type ions may be used. Afterward, a heat treatment may be once carried out to activate the ions.

Figure 2E:
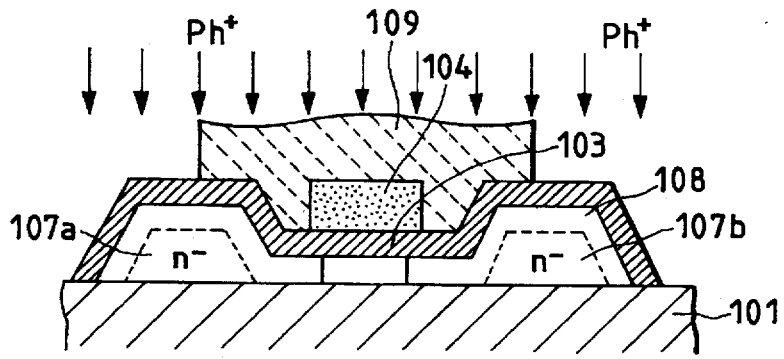

Next, a desired portion of the laminate is doped with an n-type impurity $Ph^+$ of high-concentration $n^+$ by resist patterning (FIG. 2E). As the doping method, there can be used the ion implantation method or an ion doping method. In this doping, the amount of the impurity to be implanted is in the range of $5\times10^{14}$ to $2\times10^{16}$ $cm^{-2}$. Afterward, a resist 109 is stripped, and a heat treatment is then carried out at 1000° C. for 10 minutes to activate the ions. Afterward, a silicon oxide film is deposited as thick as 600 nm by the CVC method.

Next, contact holes of the source and the drain are bored, and an Al-Si (1%) layer is then deposited as thick as 600 nm by sputtering, followed by patterning, to form wiring layers 106a, 106b, whereby the structure shown in FIG. 1 is obtained.

In the manufacturing process of the polysilicon TFT, a treatment called "hydrogenation" is usually carried out in a step after the polysilicon formation of the channel to terminate the dangling bonds of a grain boundary. The "hydrogenation" may be done in any step, but it is preferred that after the hydrogenation, a step at 450° C. or more is not intended.

In this embodiment, a high-temperature process is used, and therefore the hydrogenation is carried out after the formation of the structure shown in FIG. 1. For the hydrogenation, various manners are present, but in this embodiment, a plasma nitride film having a thickness of 50 to 800 nm is deposited on the surfaces of the wiring layers 106a, 106b to remarkably improve the mobility of the polysilicon and simultaneously to decrease the leak current. After the deposition of the nitride film, the heat treatment at 300° to 450° C. is carried out in hydrogen or a forming gas (a mixed gas of $N_2$ and $H_2$) to further increase the effect.

In this embodiment, a conductive type is the n-type, but if some necessary positions of the above-mentioned description are corrected so that the p-type TFT may be prepared, the above-mentioned description can also be applied to the p-type TFT.

As needed, the structure of this embodiment can be taken only in one of the source side and the drain side, so far as the leak current can be decreased and the mobility of the polysilicon can be improved in one of the source and the drain.

A ratio between the lengths of the thick portion and the thin portion of the low-concentration $n^-$ layer in a channel direction depends upon a working accuracy, but ideally, it is preferable that a joint portion alone with the channel region is the thin film. Practically, even if 20 to 30% of the length of the low-concentration $n^-$ layer comprises the thin film, the effect can be obtained.

Figure 3:
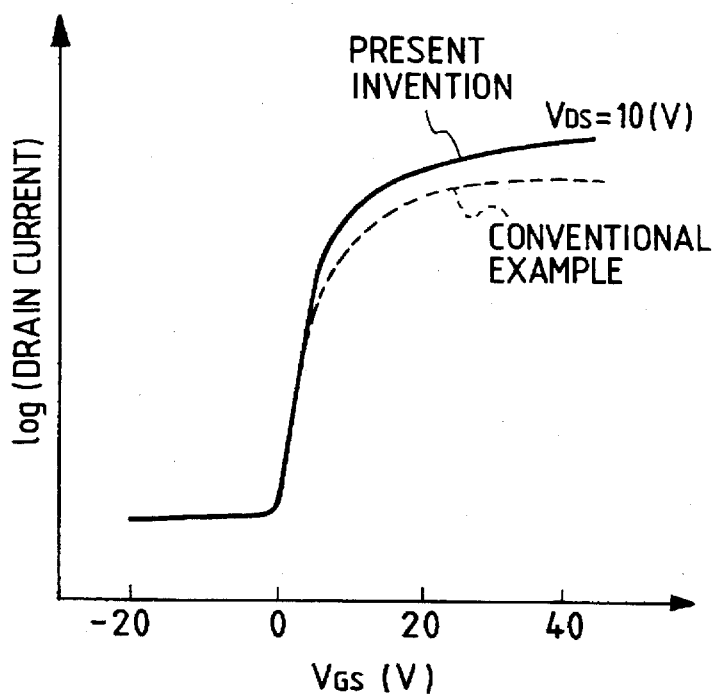
FIG. 3 shows a comparison between the current-voltage properties of one embodiment of the TFT according to the present invention and those of a conventional example.
Figure 10A:
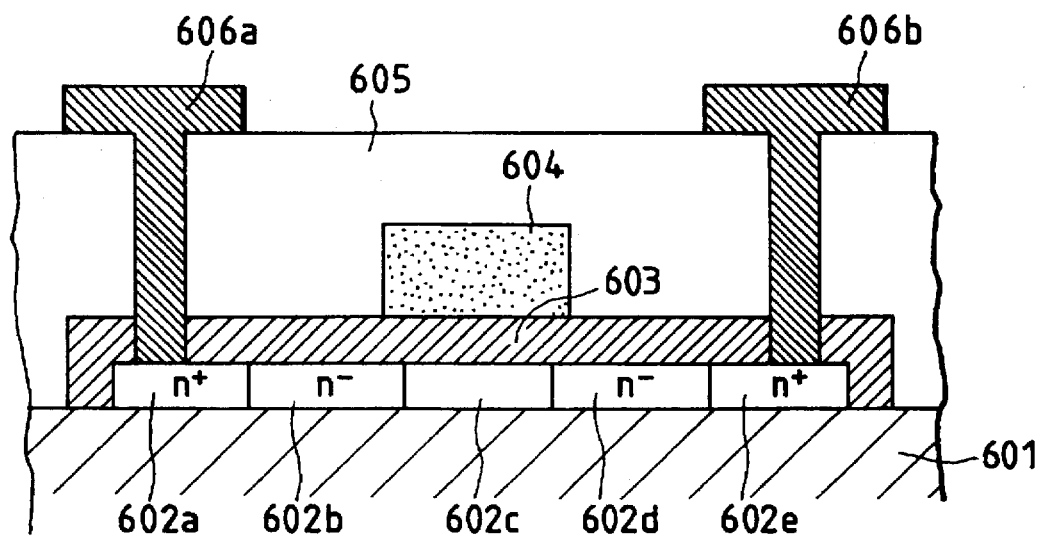
FIGS. 10A and 10B are sectional views of conventional thin film transistors TFTs.
Figure 10B:
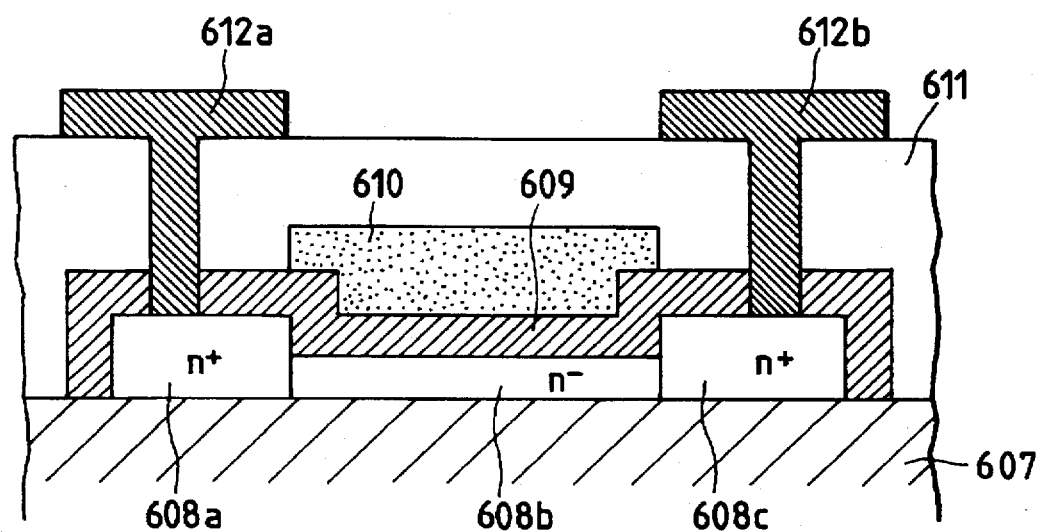

FIG. 3 shows the drain current-gate voltage characteristics of the TFT described in this embodiment. In the channel region and the low-concentration $n^-$ layer, ON current alone can be remarkably improved while OFF current is suppressed, as compared with the characteristics of the TFT having a conventional structure shown in FIGS. 10A and 10B in which the source region and the drain region have the same thickness. This is due to a fact that the parasitic source and drain resistances decrease and hence a voltage which is effectively applied between the gate and the source or between the drain and the source of the transistor increases.

Also in the case that the thickness of the polysilicon is extremely small, there lowers a possibility that the polysilicon is cut owing to the roughness of the undercoat and a TFT failure occurs. In consequence, the constitution of this embodiment can contribute to the improvement of the yield.

Embodiment 2

Figure 4:
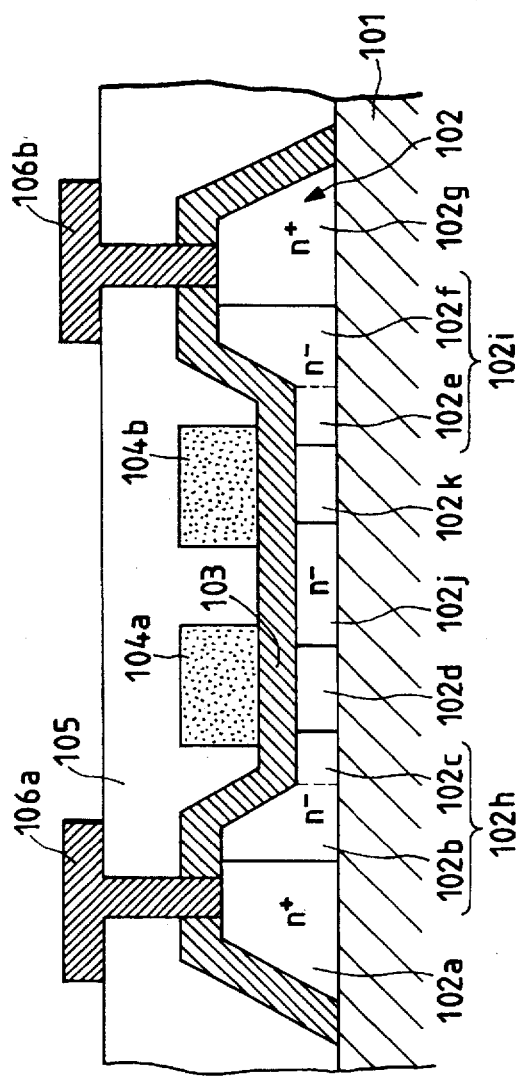
FIG. 4 is the sectional view of one embodiment of the TFT according to the present invention.

FIG. 4 shows the sectional view of Embodiment 2 of a thin film transistor according to the present invention. Embodiment 2 has the so-called dual gate structure in which two gates connected at the same potential (this connection is not shown in the sectional view) are connected in series in the lengthwise direction of a channel. In this point, Embodiment 2 is different from Embodiment 1 described above. It is known that the concentration of electric field at a drain end at the OFF of the gates is divided into a plurality of steps by the use of the above-mentioned dual gate, so that OFF current is suppressed.

In this embodiment, a low-concentration $n^-$ region comprising a thin film is interposed between the two gates, whereby the whole size of the transistor is miniaturized as much as possible. The same parts having the same roles and meanings as in Embodiment 1 are represented by the same reference numerals, and therefore the description of these parts will be omitted. The portions of this embodiment which are different from Embodiment 1 will be described. In FIG. 4, two gate electrodes 104a, 104b are arranged, and they are connected at the same potential. These two gate electrodes 104a, 104b are connected to channel regions 102d, 102k with the interposition of a gate insulating film 103, and they control the formation of carriers in channel regions 102d, 102k. The two channel regions 102d, 102k are separated by a low-concentration $n^-$ region 102j having the same film thickness as the channel region.

In this embodiment, all the same materials, constitution and manufacturing process as in Embodiment 1 are applied except that the two gates electrodes are laminated and patterned. In addition, as in a conventional case, the number of the gate electrodes having the same potential can be increased to 3, 4 or more, if necessary, to decrease leak current.

Furthermore, in this embodiment, since the dual gate structure is taken, the concentration of an electric field at a drain end can be relieved, so that an effect that OFF current decreases can be additionally obtained. Even if one of the two serially connected transistors crosses a grain boundary to completely bring about a short circuit, the other transistor can keep up a function as a switch, so that the transistors can possess a high durability and can be provided in a high yield. In addition, a liquid crystal panel to which this embodiment is applied has the TFT having a high ON/OFF ratio, and therefore the panel has a high gradation and an excellent display performance and its yield is high.

Embodiment 3

The content of Embodiment 3 regarding the present invention will be described with reference to the sectional view shown in FIG. 5. In this embodiment, a low-concentration $n^-$ layer 102j between two channel regions is replaced with two low-concentration $n^-$ layers 102l and 102n each of which is comprised of two regions of different thicknesses, and a thick high-concentration $n^+$ layer 102m interposed between 102l and 102n.

This embodiment has a structure by which the resistance of a high-resistance region can be lowered, in contrast to the dual gate structure of Embodiment 2, and the structure of this embodiment can be considered to be a constitution that the structure of Embodiment 1 is serially connected between the dual gates. According to the structure of this embodiment, the resistance between the dual gates can be lowered to relieve the concentration of an electric field at a gate end and to enable the separation of one gate from the other.

The constitution of this embodiment is the same as in Embodiments 1 and 2 except for the low-concentration $n^-$ layers 102l, 102n and the high-concentration $n^-$ layer 102m which are further added, and therefore the description of parts other than these added layers will be omitted.

It should be totally judged on the basis of a polysilicon, a wiring distance between polysilicon portions, the concentration of the low-concentration $n^-$ layers, the alignment of a channel polysilicon and a gate polysilicon, the total area of a thin film transistor and the like which structure of Embodiments 2 and 3 is more advantageous in point of the resistance. That is to say, the constitution shown in FIG. 5 is more advantageous in the case that the channel length of the low-concentration $n^-$ layer 102l and the channel length of the low-concentration $n^-$ layer 102n are equal to or sufficiently less than the space between polysilicon portions in FIG. 4.

In this embodiment, the resistance of the low-concentration $n^-$ layers which is newly generated owing to the dual gate structure can be further lowered, and the ON current of the drain and the source can be increased, in addition to the effects described in Embodiments 1 and 2.

Embodiment 4

Figure 6:
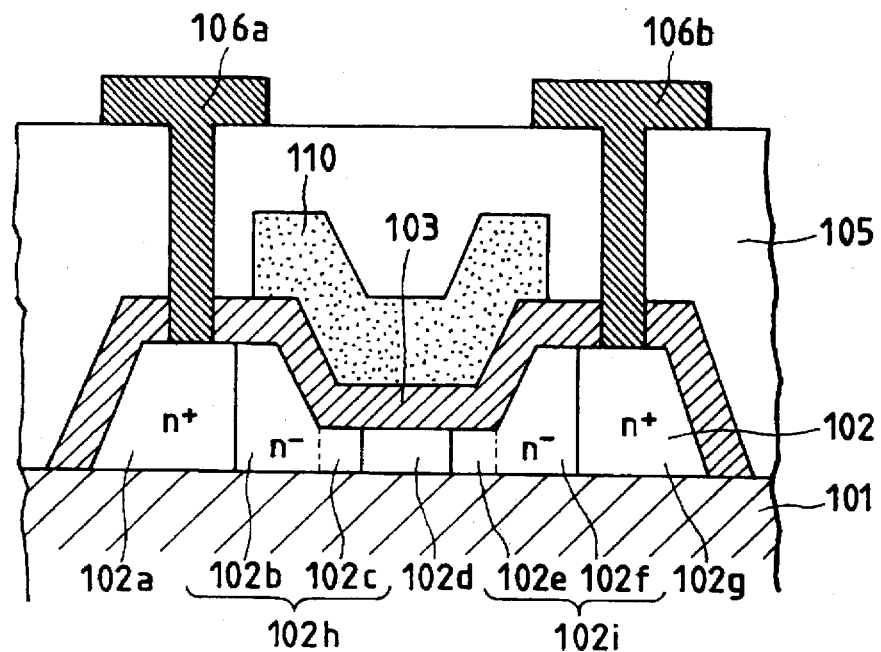
FIG. 6 is the sectional view of one embodiment of the TFT according to the present invention.

FIG. 6 shows the sectional structure of Embodiment 4 regarding the present invention. In this embodiment, a positional relation between a gate electrode and low-concentration $n^-$ regions in Embodiment 1 is changed. That is to say, a gate electrode 110 extends onto the thick portions of a polysilicon so as to cover a part or all of low-concentration $n^-$ regions 102h, 102i. According to such a structure, the resistance of the low-concentration $n^-$ layers can be reduced as much as possible, while OFF current is suppressed. As in Embodiments 1 to 3, the same parts are represented by the same reference numerals, and the description of them will be omitted.

In FIG. 6, a gate electrode 110 covers a part of a thick polysilicon film, and a distance between high-concentration $n^+$ regions 102a, 102g is fairly shorter than in Embodiment 1. As a result, the resistance attributed to the low-concentration $n^-$ layers is slight.

As a manufacturing process for Embodiment 4, the process in Embodiment 1 can be used which is slightly changed and to which additional steps are added. That is to say, the doping of the low-concentration $n^-$ layers is carried out by a polysilicon gate electrode self alignment, and it is necessary that the low-concentration $n^-$ layers are then sufficiently pushed to a part of a thin polysilicon region by a heat treatment. Furthermore, in the case that a distance between high-concentration $n^+$ layers and a gate electrode 110 is 0.4 µm or less, a side wall insulating film is left on the side wall of the gate electrode 110 by an etch back method, and the so-called LDD structure (lightly diffused drain structure), in which the high-concentration $n^+$ layers are subjected to doping to this side wall by the self alignment, can be taken. This method is a perfect self alignment process, and therefore the unevenness of an offset amount by the deviation of the alignment can be completely eliminated.

Figure 5:
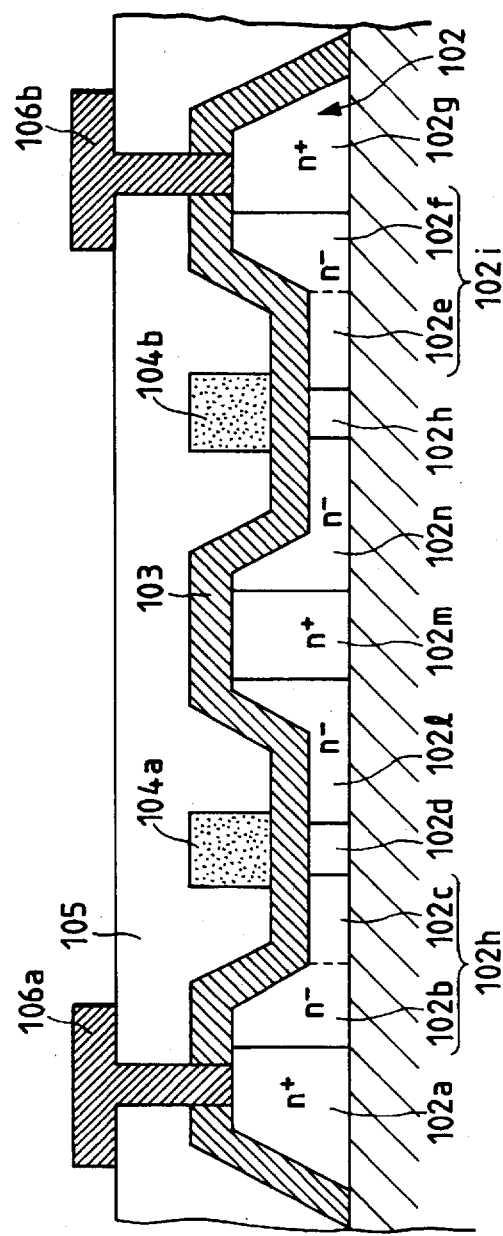
FIG. 5 is the sectional view of one embodiment of the TFT according to the present invention.

Furthermore, in the case of FIG. 5, the high-concentration $n^+$ layers can also be subjected to the doping to a gate electrode by the self alignment. The positional relation between the gate electrode and the low-concentration $n^-$ layers in this embodiment, needless to say, can be applied to other Embodiments 2 and 3.

Embodiment 4 has the following effects in addition to the effects of Embodiment 1:

(1) The resistance of the low-concentration $n^-$ layers can be further lowered.

(2) Since the LDD structure utilizing the side wall insulating film can be taken, the relative positional relation between the gate electrode and the high-concentration $n^+$ layers does not change by the alteration of the process. Therefore, the TFT having stable characteristics can be manufactured in a high yield.

[EXAMPLES]

Example 1

Example 1 is concerned with a TFT shown in FIG. 1 described in Embodiment 1. The TFT was prepared by the use of the manufacturing process described with reference to FIGS. 2A to 2E in Embodiment 1. In this case, thick film regions 107a, 107b in FIG. 2A were formed at an angle of 30° to 70° to surely cover steps. Next, a polysilicon thin film 108 which also became a channel region was formed, as shown in FIG. 2B. In the step of FIG. 2E, doping with phosphorus ions was carried out with an energy of $5 \times 10^{15}$ $cm^{-2}$, 95 keV by ion implantation method. Afterward, a resist 109 was stripped, and a heat treatment was then carried out at 1000° C. for 10 minutes to activate the ions. Afterward, a silicon oxide film was deposited as thick as 600 nm by a CVC method. Next, contact holes of the source and the drain were bored, and an Al-Si (1%) layer was then deposited as thick as 600 nm by sputtering, followed by patterning, to form wiring layers 106a, 106b, whereby the structure shown in FIG. 1 was obtained.

According to the above-mentioned constitution, the resistance of low-concentration n⁻ layers could be reduced while a contact area between a channel region and a drain region was sufficiently decreased, and a thin film transistor having a higher ON/OFF ratio than in a conventional case could be constituted.

Example 2

Figure 7:
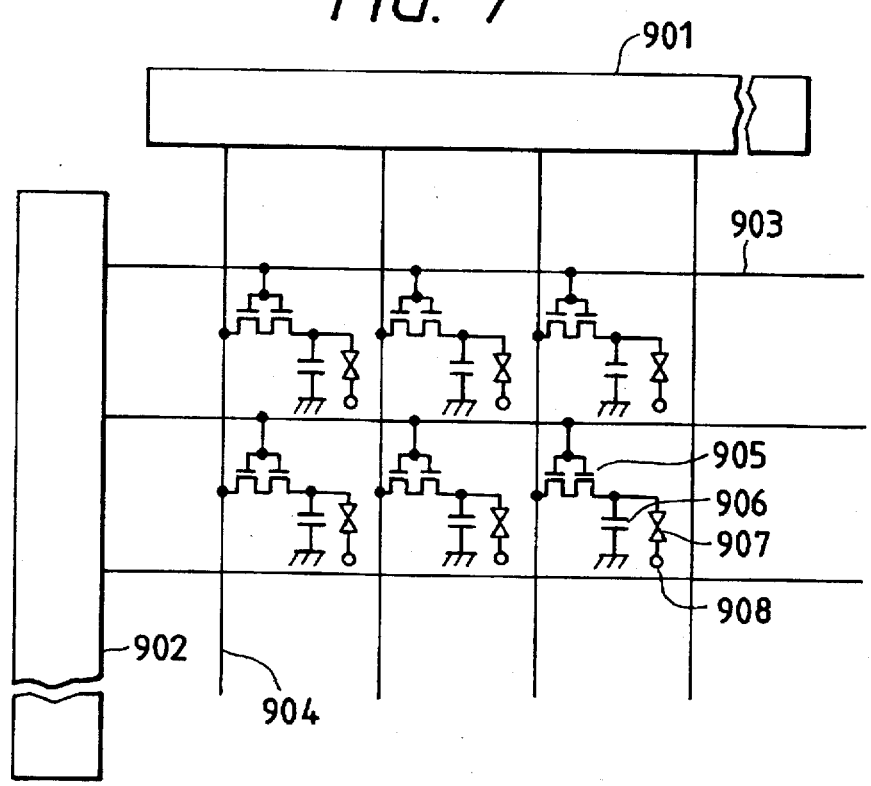
FIG. 7 is the circuit block diagram of a TFT substrate for a liquid crystal display panel to which the TFT according to the present invention is applied.

The thin film transistors obtained by Embodiment 2 are applied to a liquid crystal display. FIG. 7 is the circuit block diagram of a TFT substrate for the liquid crystal display. In this drawing, thin film transistor TFTs 905 for driving picture cells are arranged in a matrix state at the respective intersections of many scanning lines 903 and signal lines 904 emitted from a horizontal shift register 901 and a vertical shift register 902. The gate of each TFT 905 has a dual gate structure comprising two gate electrodes, but it may be one gate electrode shown in FIG. 1. The gist of the present invention is not limited to this example. Each source is connected to each signal line 904, and each drain is connected to a holding capacity 906 and a driving electrode of a liquid crystal 907 and confronts a common potential 908 to pinch the liquid crystal. Each scanning line 903 is driven in response to the vertical scanning of a TV signal or a computer to write a video signal transferred from the horizontal shift register in each picture cell.

In the case that the thin film transistor TFT of a polysilicon is used, the horizontal shift register 901 and the vertical shift register 902 can easily be integrated on the TFT substrate. At this time, each shift register can be made of a polysilicon TFT as the picture cells, or the shift register can be formed into a silicon substrate of a single crystal. In addition, as a liquid crystal panel, a reflective type panel or a permeable type panel can be constituted.

Figure 8:
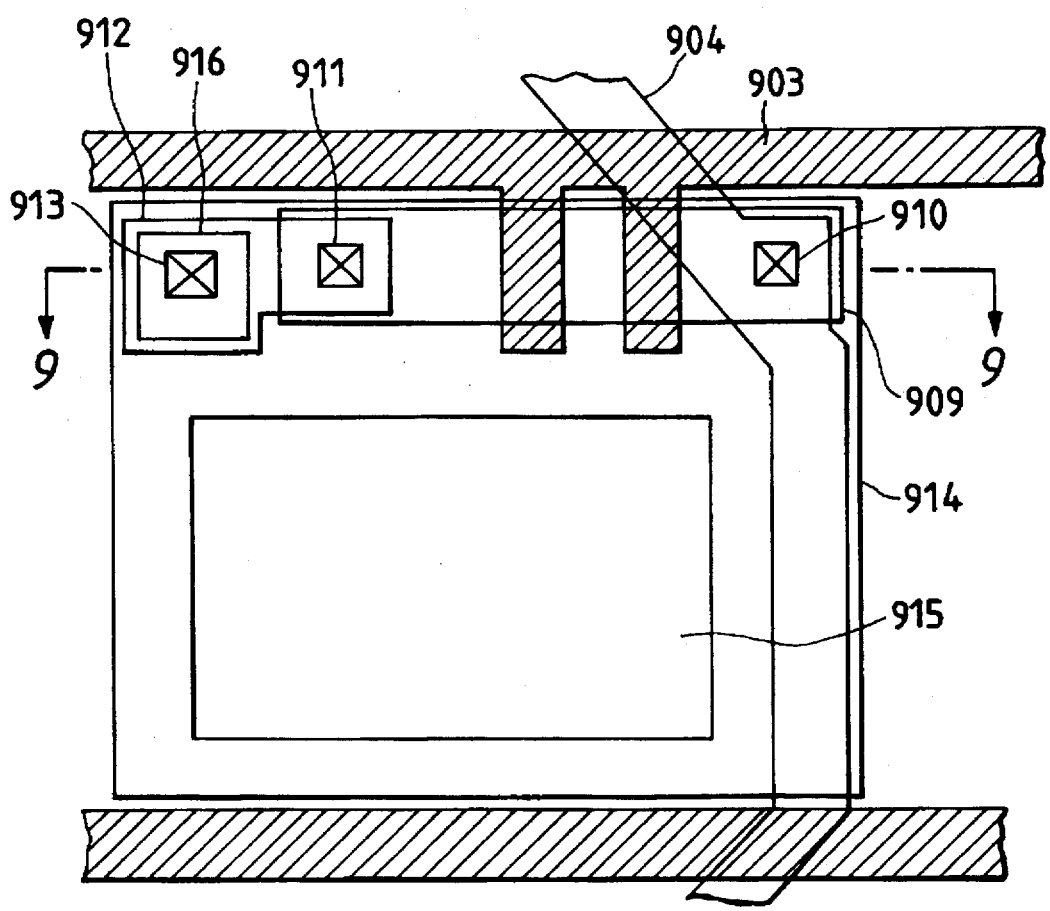
FIG. 8 is the plan view of one embodiment of a picture cell containing the TFT for the liquid crystal display panel shown in FIG. 7.

FIG. 8 shows one example of a planar layout view of one optional picture cell. The polysilicon scanning line 903 is superposed at two positions on a thin film polysilicon 909 for preparing a source, a drain and a channel of the thin film transistor TFT to form the dual gate of the TFT. The aluminum signal line 904 is connected to the thin film polysilicon 909 at a source contact 910. On the other hand, the other end of the TFT is connected to an aluminum pad 912 via a drain contact 911 and further connected via a through-hole 913 to a picture cell transparent electrode 914 for pinching the liquid crystal. The plan view is wholly covered with a light shielding film except for an opening 915 for display and a through-hole opening 916 for opening the through-hole 913. In this layout, as one example of a structure suitable for the fine picture cells, the light shielding film is used as one end of the electrode of the holding capacity 906 in FIG. 9, and the holding capacity 906 is formed at a position where a picture cell transparent electrode 914 is superposed on the light shielding film in a plane state.

Figure 9:
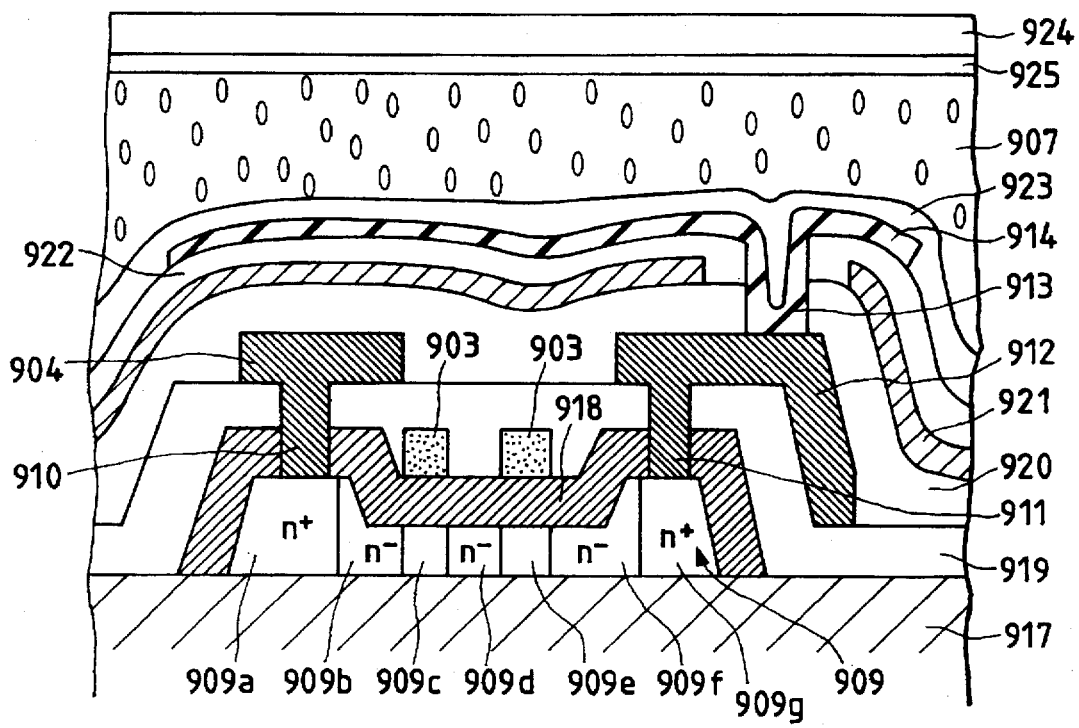
FIG. 9 is the partial sectional view of the picture cell containing the TFT for the liquid crystal display panel shown in FIG. 8.
Figure 11:
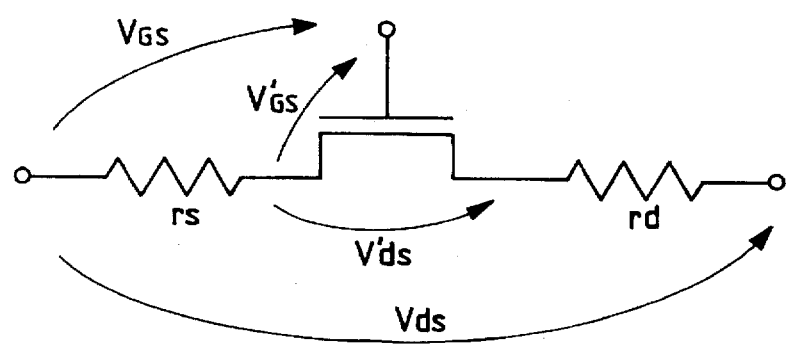
FIG. 11 is an equivalent circuit view illustrating the parasitic resistance of the thin film transistor TFT.

FIG. 9 is a sectional view cut along the line 9—9 in FIG. 8, and the thin film transistor TFT which is the gist of the present invention is applied. The same parts as in FIG. 8 are represented by the same reference numerals. The thin film transistor TFT is formed on a surface insulating substrate 917, and in the thin film polysilicon 909, there are arranged a source high-concentration n⁺ layer 909a, a source low-concentration n⁻ layer 909b, a first channel region 909c, an intermediate low-concentration n⁻ layer 909d, a second channel region 902e, a drain low-concentration n⁻ layer 909f and a drain high-concentration n⁺ layer 909g in this order. The first and second channel regions confront gate electrodes 903 via a silicon oxide film 918. Aluminum electrodes are connected to the thin film polysilicon via a source contact 910 and a drain contact 911, respectively.

Between the aluminum electrodes 904, 912 and the gate electrodes 903, a first interlayer insulating film 919 is interposed so as to cover the gate electrodes 903. The aluminum electrode 912 is connected to the picture cell transparent electrode 914 via the through-hole 913. At this time, in order to improve an ohmic contact between the aluminum electrode 912 and ITO for use in the picture cell transparent electrode 914, for example, titanium or titanium silicide is suitably deposited on the surface of the aluminum electrode 912. This aluminum electrode 912 is covered with a second interlayer insulating film 920, and a light shielding film 921 is put thereon. As a material for the light shielding film 921, there can be used, for example, titanium, titanium silicide, tantalum, tantalum silicide or tungsten. Between the transparent electrode 914 and the light shielding film 921, a capacity film 922 for forming a holding capacity is present. As the capacity film 922, a plasma nitride film for enhancing the effect of hydrogenation is effective, but a nitrogen oxide film or a silicon oxide film is also usable.

All over the surface of the transparent electrode 914, an oriented film 923 which has undergone a rubbing treatment is deposited, and a liquid crystal 907 is pinched, confronting a common electrode 923 (e.g., a transparent electrode) on a confronted substrate 924. Furthermore, the transparent electrode is connected to the drain electrode, but the drain electrode can be replaced with the source electrode in view of a design.

As the liquid crystal 907, a TN type can be used as one example in the case of a transparent type, and a polymer dispersion type can be used as one example in the case of a reflective type panel.

It has been understood that since the liquid crystal panel having the above-mentioned structure has a high ON/OFF ratio of the TFT, the display of a high gradation can be realized in a high yield.

What is claimed is:

1. A thin film transistor which comprises a source region, a drain region and a channel region formed in a thin film poly-silicon region on an insulating substrate and a gate electrode formed via a gate insulating film on the channel region; each of the source region and the drain region having a high-concentration impurity region and a low-concentration impurity region; the channel region being in contact with the low-concentration impurity regions;

each of the low-concentration impurity regions comprising at least a first region and a second region; the first region comprising a thin film having about the same thickness as the channel region; the second region comprising a thin film having about the same thickness as the respective high-concentration impurity region which is thicker than the first region.

2. The thin film transistor according to claim 1, wherein the gate electrode is divided into a plurality of portions in current flow directions between the source and drain regions, and all the divided gate electrodes are connected to a common potential.

3. The thin film transistor according to claim 1, wherein a part of the gate electrode overlaps a part of each second region.

4. A liquid crystal display having TFT substrates wherein the thin film transistors described in any one of claims 1 to 3 are arranged in the form of a matrix.

5. The thin film transistor according to claim 1, wherein the gate electrode is divided into a plurality of portions in current flow directions between the source and drain regions, and the channel regions under the divided gate electrodes are connected to each other via a further low-concentration impurity region.

6. The thin film transistor according to claim 1, wherein the gate electrode is divided into a plurality of portions in current flow directions between the source and drain regions, and wherein the channel regions under the divided gate electrodes are connected with each other via a further high-concentration impurity region and two further low-concentration impurity regions provided on either side of the further high-concentration impurity region.

7. The thin film transistor according to claim 6, wherein the further high-concentration impurity region and the high-concentration impurity regions in the source and drain regions have about the same thickness, and wherein each of the low-concentration impurity regions comprise at least a further first region and a further second region; the further first region comprising a thin film having about the same thickness as the channel region; the further second region comprising a thin film having about the same thickness as the further high-concentration impurity region.

8. A liquid crystal display equipped with a plurality of thin film transistors each of which comprise a source region, a drain region and a channel region formed in a thin film poly-silicon region on an insulating substrate and a gate electrode formed via a gate insulating film on the channel region; each of the source region and the drain region having a high-concentration impurity region and a low-concentration impurity region; the channel region being in contact with the low-concentration impurity regions;

each of the low-concentration impurity regions comprising at least a first region and a second region; the first region comprising a thin film having about the same thickness as the channel region; the second region comprising a thin film having about the same thickness as the respective high-concentration impurity region which is thicker than the first region.

9. The thin film transistor according to claim 8, wherein the gate electrode is divided into a plurality of portions in current flow directions between the source and drain regions, and all the divided gate electrodes are connected to a common potential.

10. The thin film transistor according to claim 8, wherein a part of the gate electrode overlaps a part of each second region.

11. A liquid crystal display having TFT substrates wherein the thin film transistors described in any one of claims 8, 9 and 10 are arranged in the form of a matrix.

12. The thin film transistor according to claim 8, wherein the gate electrode is divided into a plurality of portions in current flow directions between the source and drain regions, and the channel regions under the divided gate electrodes are connected to each other via a further low-concentration impurity region.

13. The thin film transistor according to claim 8, wherein the gate electrode is divided into a plurality of portions in current flow directions between the source and drain regions, and wherein the channel regions under the divided gate electrodes are connected with each other via a further high-concentration impurity region and two further low-concentration impurity regions provided on either side of the further high-concentration impurity region.

14. The thin film transistor according to claim 13, wherein the further high-concentration impurity region and the high-concentration impurity regions in the source and drain regions have about the same thickness, and wherein each of the low-concentration impurity regions comprise at least a further first region and a further second region; the further first region comprising a thin film having about the same thickness as the channel region; the further second region comprising a thin film having about the same thickness as the further high-concentration impurity region.

* * * * *

UNITED STATES PATENT AND TRADEMARK OFFICE
CERTIFICATE OF CORRECTION

PATENT NO. : 5,693,959

DATED : December 2, 1997

INVENTOR(S): SHUNSUKE INOUE ET AL.

It is certified that error appears in the above-identified patent and that said Letters Patent is hereby corrected as shown below:

ON THE TITLE PAGE, AT [30], FOREIGN APPLICATION PRIORITY DATA

"Mar. 3, 1996 [JP]  Japan" should read --Apr. 3, 1996 [JP] Japan--.

ON THE TITLE PAGE, AT [56], REFERENCES CITED FOREIGN PATENT DOCUMENTS

"3220774  9/1991" should read --3-220774  9/1991--;
"5267327  11/1993 should read --5-267327  10/1993--.

COLUMN 3

Line 67, "thicken" should read --increased--.

COLUMN 5

Line 55, "high" should read --higher--.

COLUMN 7

Line 26, "pate" should read --gate--.

UNITED STATES PATENT AND TRADEMARK OFFICE
CERTIFICATE OF CORRECTION

PATENT NO. : 5,693,959

DATED : December 2, 1997

INVENTOR(S): SHUNSOUKE INOUE ET AL.

It is certified that error appears in the above-identified patent and that said Letters Patent is hereby corrected as shown below:

<u>COLUMN 8</u>

Line 57, "there lowers" should read --there is a lower--.

<u>COLUMN 9</u>

Line 24, "gates" should read --gate--.

<u>COLUMN 13</u>

Line 46, "comprise" should read --comprises--;
Line 48, "poly-silicon" should read --polysilicon--.

Signed and Sealed this

Fourteenth Day of July, 1998

Attest:

BRUCE LEHMAN

Attesting Officer    Commissioner of Patents and Trademarks